(12) United States Patent
Fu et al.

(10) Patent No.: US 11,370,888 B2
(45) Date of Patent: Jun. 28, 2022

(54) SILICON-RICH SILSESQUIOXANE RESINS

(71) Applicant: Dow Silicones Corporation, Midland, MI (US)

(72) Inventors: Peng-Fei Fu, Midland, MI (US); Wonbum Jang, Cheongju (KR)

(73) Assignee: Dow Silicones Corporation, Midland, MI (US)

( * ) Notice: Subject to any disclaimer, the term of this patent is extended or adjusted under 35 U.S.C. 154(b) by 274 days.

(21) Appl. No.: 16/099,278

(22) PCT Filed: Jun. 8, 2017

(86) PCT No.: PCT/US2017/036524
§ 371 (c)(1),
(2) Date: Nov. 6, 2018

(87) PCT Pub. No.: WO2017/218286
PCT Pub. Date: Dec. 21, 2017

(65) Prior Publication Data
US 2019/0211155 A1 Jul. 11, 2019

Related U.S. Application Data

(60) Provisional application No. 62/350,836, filed on Jun. 16, 2016, provisional application No. 62/419,547, filed on Nov. 9, 2016.

(51) Int. Cl.
| | | |
|---|---|---|
| *G03F 7/039* | (2006.01) | |
| *G03F 7/075* | (2006.01) | |
| *C08G 77/04* | (2006.01) | |
| *C08G 77/46* | (2006.01) | |
| *C08G 77/06* | (2006.01) | |
| *C08G 77/16* | (2006.01) | |
| *G03F 7/023* | (2006.01) | |
| *C08G 77/14* | (2006.01) | |
| *C08G 77/00* | (2006.01) | |

(52) U.S. Cl.
CPC ........... *C08G 77/46* (2013.01); *C08G 77/045* (2013.01); *C08G 77/06* (2013.01); *C08G 77/14* (2013.01); *C08G 77/16* (2013.01); *G03F 7/0233* (2013.01); *G03F 7/0392* (2013.01); *G03F 7/0757* (2013.01); *C08G 77/70* (2013.01)

(58) Field of Classification Search
CPC .... G03F 7/0392; G03F 7/0233; G03F 7/0757; C08G 77/46; C08G 77/045; C08G 77/16; C08G 77/06; C08G 77/14; C08G 77/70
See application file for complete search history.

(56) References Cited

U.S. PATENT DOCUMENTS

| | | | |
|---|---|---|---|
| 4,189,323 A | 2/1980 | Buhr | |
| 6,531,260 B2 | 3/2003 | Iwasawa et al. | |
| 6,596,834 B2 * | 7/2003 | Zhong | C09D 183/04 |
| | | | 528/31 |
| 7,052,820 B2 | 5/2006 | Rottstegge et al. | |
| 7,261,992 B2 | 8/2007 | Sooriyakumaran et al. | |
| 7,390,608 B2 | 6/2008 | Barclay et al. | |
| 7,507,783 B2 | 3/2009 | Meador et al. | |
| 7,625,687 B2 | 12/2009 | Hu et al. | |
| 8,088,547 B2 | 1/2012 | Hu et al. | |
| 8,148,043 B2 | 4/2012 | Hu et al. | |
| 8,524,439 B2 | 9/2013 | Hu et al. | |
| 8,728,335 B2 | 5/2014 | Fu et al. | |
| 8,809,482 B2 | 8/2014 | Fu et al. | |
| 8,992,790 B2 | 3/2015 | Ogihara et al. | |
| 2003/0017415 A1 | 1/2003 | Kodama et al. | |
| 2007/0281242 A1 | 12/2007 | Hu et al. | |
| 2009/0068586 A1 | 3/2009 | Nakamura et al. | |
| 2009/0123701 A1 * | 5/2009 | Fu | C08G 77/12 |
| | | | 428/154 |
| 2011/0003249 A1 * | 1/2011 | Bradford | G03F 7/091 |
| | | | 430/270.1 |
| 2011/0236835 A1 | 9/2011 | Fu et al. | |
| 2014/0242516 A1 * | 8/2014 | Ogawa | C09D 183/06 |
| | | | 430/272.1 |
| 2019/0169436 A1 * | 6/2019 | Altergott | C08K 5/54 |
| 2019/0171106 A1 * | 6/2019 | Fu | C07F 7/21 |

FOREIGN PATENT DOCUMENTS

| | | | | |
|---|---|---|---|---|
| EP | 1142928 | * 10/2001 | ............ | G03F 7/039 |
| EP | 1582925 | 10/2015 | | |
| JP | 10251519 | 9/1998 | | |

(Continued)

OTHER PUBLICATIONS

C. L. Frye; W. T. Collins, J. Am. Chem. Soc., 1970; 92:5586.

(Continued)

*Primary Examiner* — Martin J Angebrannt

(57) ABSTRACT

A silsesquioxane resin, photoresist composition comprising the silsesquioxane resin and a photoacid generator, etching mask composition comprising the silsesquioxane resin, products prepared therefrom, methods of making and using same, and manufactured articles and semiconductor devices containing same. The silsesquioxane resin comprises silicon-bonded hydrogen atom T-units and T-units having a silicon-bonded group of formula $-CH_2CH_2CH_2CO_2C(R^{1a})_3$ or $-CH(CH_3)CH_2CO_2C(R^{1a})_3$, wherein each $R^{1a}$ is independently an unsubstituted $(C_1-C_2)$alkyl.

13 Claims, No Drawings

(56) References Cited

FOREIGN PATENT DOCUMENTS

| JP | 2007154047 | 6/2007 |
|----|------------|--------|
| WO | 2007066635 | 1/2005 |
| WO | 2013060087 | 5/2013 |

OTHER PUBLICATIONS

F. Orsini, Synthetic Common., 1982; vol. 12, No. 14, pp. 1147-1154.
Kamyar Rahimian et al: "Soluble, High Molecular Weight Polysilsesquioxanes with Carboxylate Functionalities", Macromolecules, vol. 35, No. 7, Mar. 1, 2002 (Mar. 1, 2002), pp. 2452-2454.
Search report from corresponding China 2017800371107 application, dated Dec. 8, 2020.
Search report from corresponding Japan 2018-565068 application, dated May 26, 2021.

* cited by examiner

SILICON-RICH SILSESQUIOXANE RESINS

TECHNICAL FIELD

A silsesquioxane resin, photoresist composition comprising the silsesquioxane resin and a photoacid generator, etching mask composition comprising the silsesquioxane resin, products prepared therefrom, methods of making and using same, and manufactured articles and semiconductor devices containing same.

BACKGROUND OF THE RELATED ART

Integrated circuits (ICs) appear in almost every new manufacture, including airplanes, automobiles, computers, cameras, home appliances, industrial machines, mobile telephones, and robots. Finer circuit patterns enable higher performance and smaller form factors.

ICs may be made from a resist article comprising a photoresist layer disposed on a patternable substrate using a photolithography method. The photoresist layer comprises a photoresist composition comprising a light-sensitive material comprising a polymer. The patternable substrate comprises a semiconductor material or an electrically conductive metal. In some configurations of the resist article, the photoresist layer is disposed directly on (in physical contact with) the patternable substrate. In other configurations, the resist article further comprises at least one intervening layer, which is/are sandwiched (disposed) between, and spaces apart, the photoresist layer and the patternable substrate.

The photolithography method comprises forming a pattern with ultraviolet (UV) light in the photoresist layer, and transferring the pattern via etching from the photoresist layer into the patternable substrate. When the resist article is configured with the at least one intervening layer, the method comprises sequentially forming the pattern in the photoresist layer, transferring the pattern via a first etching step from the photoresist layer into the at least one intervening layer, and then transferring the pattern via a second etching step from the at least one intervening layer into the patternable substrate. The first and/or second etching step(s) may independently comprise plasma etching or reactive-ion etching such as deep reactive-ion etching. The etching uses an etchant to form the plasma or reactive ions. The etchant may comprise molecular oxygen for use in plasma etching or a halocarbon such as tetrachloromethane or trifluoromethane for reactive-ion etching. If, however, the etching mask layer is too resistant to etching, the photoresist pattern will not be transferred downward into the patternable substrate. If the etching mask layer is not resistant enough to etching during the etching step, the etching mask layer will be laterally undercut or completely etched away before the pattern can be transferred downward into the patternable substrate. For best results, optimal etching is an anisotropic process wherein the pattern is transferred downward into the patternable substrate at an etch rate that is faster than the undercut rate at which the pattern is laterally degraded or undercut by the harsh etching environment.

To enable anisotropic etching, the resist article may comprise the at least one intervening layer that is an etching mask layer, which is sandwiched (disposed) between the photoresist layer and the patternable substrate. The etching mask layer comprises an etching resistant composition that, upon being exposed to etching conditions, enables the photoresist pattern to be anisotropically transferred via the first and second etching steps to the patternable substrate.

BRIEF SUMMARY OF THE INVENTION

We (the present inventors) have discovered a problem with incumbent photoresist compositions. They typically are not resistant enough to etching to be used as the etching mask composition, and instead they are severely undercut or etched away in an etching step (post-photopatterning). Also, a variety of incumbent etching mask compositions are known and typically are not photopatternable, or at least they do not enable forming finer patterns or circuits. Thus, incumbent resist articles require different compositions for the photoresist layer and etching mask layer, which complicate incumbent photopatterning methods by requiring the first and second etching steps to use different etchants and/or etching processes.

Our technical solution comprises a silsesquioxane resin, photoresist composition comprising the silsesquioxane resin and a photoacid generator, etching mask composition comprising the silsesquioxane resin, products prepared therefrom, methods of making and using same, and manufactured articles and semiconductor devices containing same. The silsesquioxane resin comprises silicon-bonded hydrogen atom T-units and T-units having a silicon-bonded group of formula $-CH_2CH_2CH_2CO_2C(R^{1a})_3$ or $-CH(CH_3)CH_2CO_2C(R^{1a})_3$, wherein each $R^{1a}$ is independently an unsubstituted $(C_1-C_2)$alkyl.

DETAILED DESCRIPTION OF THE INVENTION

The Brief Summary and Abstract are incorporated here by reference. This invention is described herein in an illustrative manner by disclosing a plurality of representative, non-limiting embodiments and examples. In some embodiments the invention is any one of the following numbered aspects.

Aspect 1. A silsesquioxane resin of formula (I): $[HSiO_{3/2}]_h[R^1SiO_{3/2}]_b[R^2SiO_{3/2}]_n[R^3SiO_{3/2}]_v[HOSiO_{3/2}]_o[SiO_{4/2}]_q$ (I), wherein subscript h is a mole fraction from 0.30 to 0.90; each $R^1$ is independently of formula $-CH_2CH_2CH_2CO_2C(R^{1a})_3$ or $-CH(CH_3)CH_2CO_2C(R^{1a})_3$, wherein each $R^{1a}$ is independently an unsubstituted $(C_1-C_2)$alkyl; subscript b is a mole fraction from 0 to 0.48; each $R^2$ is independently bicyclo[2.2.1]heptane-5-carboxylic acid-2-yl 1,1-dimethylethyl ester or bicyclo[2.2.1]heptane-5-carboxylic acid-3-yl 1,1-dimethylethyl ester; subscript n is a mole fraction from 0 to 0.35; wherein the sum (b+n) is greater than zero; each $R^3$ is independently a polyether group or an ester group; and subscript v is a mole fraction from 0 to 0.15; subscript o is a mole fraction from 0 to 0.30; subscript q is a mole fraction from 0 to 0.1; wherein the sum (h+o+q)=from 0.52 to 0.90; wherein the sum (b+n+v+o+q)=from 0.10 to 0.48. In some embodiments, one $R^{1a}$ is methyl and each of the other $R^{1a}$ is ethyl. In some embodiments two $R^{1a}$ is methyl and the other $R^{1a}$ is ethyl. In some embodiments each $R^{1a}$ is methyl. When each $R^{1a}$ is methyl, each $R^1$ is of formula $-CH_2CH_2CH_2CO_2C(CH_3)_3$ or $-CH(CH_3)CH_2CO_2C(CH_3)_3$. Mole fraction values for subscripts h, b, n, v, o, and q may be determined using $^{29}$Si-NMR. Subscripts n, v, o, or q may be said to be 0 under either circumstance (i) or (ii): (i) when the silsesquioxane resin of formula (I) is free of its respective unit (i.e., when the unit is absent) or (ii) when the unit is present but the concentration of that unit in the silsesquioxane resin of formula (I) is below the level of detection afforded by $^{29}$Si-NMR. Below level of detection means that no peak resonance for that unit can be detected using $^{29}$Si-NMR as described later. When a subscript value is said herein to be >0, it means that a peak resonance for that unit can be detected using $^{29}$Si-NMR.

Aspect 2. The silsesquioxane resin of aspect 1 wherein subscript h is from 0.40 to 0.90, alternatively from 0.60 to 0.90.

Aspect 3. The silsesquioxane resin of aspect 1 or 2 wherein subscript v is 0, alternatively subscript v is from >0 to 0.15.

Aspect 4. The silsesquioxane resin of any one of aspects 1 to 3 wherein subscript o is 0, subscript q is 0, or both subscript o and subscript q is 0. In such aspects subscript h may be from 0.52 to 0.90.

Aspect 5. The silsesquioxane resin of any one of aspects 1 to 3 wherein subscript o is from >0 to 0.30, subscript q is from >0 to 0.1, or subscript o is from >0 to 0.30 and subscript q is from >0 to 0.10. In some aspects subscript o is from 0.01 to 0.10 and subscript q is from 0.005 to 0.02. In such aspects subscript h may be from 0.30 to <0.90, alternatively from 0.40 to <0.90. The silsesquioxane resin of formula (I) wherein subscript o is >0 and/or subscript q is >0 may be synthesized from the silsesquioxane resin of formula (I) wherein subscript o is 0 and subscript q is 0 by treating the silsesquioxane resin of formula (I) wherein subscript o is 0 and subscript q is 0 with water so as to convert some, but not all, of the units of formula [HSiO$_{3/2}$] to the units of formula [HOSiO$_{3/2}$] or [HOSiO$_{3/2}$] and [SiO$_{4/2}$], thereby lowering the mole fraction value for subscript h and commensurately increasing the mole fraction value(s) for subscript o or subscripts o and q, respectively.

Aspect 6. The silsesquioxane resin of any one of aspects 1 to 5 wherein subscript n is 0 and subscript v is 0. When subscript n is 0, the unit of formula [R$^2$SiO$_{3/2}$] is absent or not detected using $^{29}$Si-NMR. When subscript v is 0, the unit of formula [R$^3$SiO$_{3/2}$] is absent or not detected using $^{29}$Si-NMR.

Aspect 7. The silsesquioxane resin of any one of aspects 1 to 6 wherein subscript b is from 0.11 to 0.40; or each R$^1$ is of formula —CH$_2$CH$_2$CH$_2$CO$_2$C(CH$_3$)$_3$ or —CH(CH$_3$)CH$_2$CO$_2$C(CH$_3$)$_3$; or subscript b is from 0.11 to 0.40 and each R$^1$ is of formula —CH$_2$CH$_2$CH$_2$CO$_2$C(CH$_3$)$_3$ or —CH(CH$_3$)CH$_2$CO$_2$C(CH$_3$)$_3$.

Aspect 8. The silsesquioxane resin of any one of aspects 1 to 7 wherein each R$^1$ is independently of formula —CH$_2$CH$_2$CH$_2$CO$_2$C(CH$_3$)$_3$.

Aspect 9. The silsesquioxane resin of any one of aspects 1 to 8 wherein each R$^3$ is a polyether group or an ester group. The polyether group is an organic substituent having hydrocarbon units linked through oxygen atom, exemplified by —(CH$_2$)$_a$[O(CR$_2$)$_b$]$_c$ OR', wherein a=2 to 12, b=2-6; c=2-200; R is H, or a hydrocarbon group such as methyl or ethyl; R' is H, methyl, ethyl, C(O)Me, or other organic groups. Examples of such polyether groups include but are not limited to:

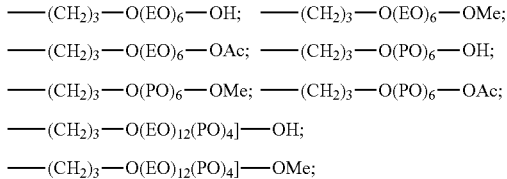

-continued

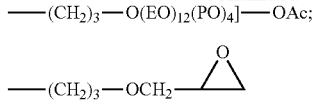

wherein EO is —(CH$_2$CH$_2$O)— and PO is —(CHMeCH$_2$O)—, Me is methyl, and Ac is acetyl.

The ester group is any organic substitute containing at least one ester functionality. Examples of ester groups include but not limited to:

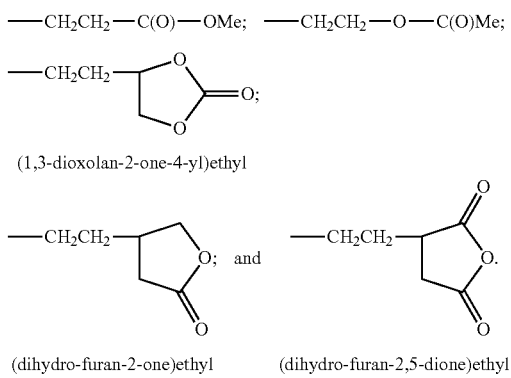

Aspect 10. The silsesquioxane resin of any one of aspects 1 to 9 wherein the silsesquioxane resin has a silicon atom content of from 23.0 weight percent (wt %) to 42 wt %, alternatively from >30 to 42 wt %, alternatively from 24 to 30 wt %, alternatively from 24.5 to 28.0 wt %, alternatively 24.8 to 27.5 wt %.

Aspect 11. A method of making the silsesquioxane resin of any one of aspects 1 to 10, the method comprising contacting a hydrogen silsesquioxane resin of formula [HSiO$_{3/2}$] with effective relative amounts 3-butenoic acid 1,1-dimethyl ethyl ester and, optionally, norbornene-5-carboxylic acid 1,1-dimethylethyl ester (when subscript n is from >0 to 0.35) and/or 4-vinyl-1,3-dioxolan-2-one (when subscript v in formula (I) is from >0 to 0.15) in the presence of a hydrosilylation reaction catalyst so as to give the silsesquioxane resin of formula (I) of aspect 1. The starting hydrogen silsesquioxane resin of formula [HSiO$_{3/2}$] may consist essentially of T-units of the formula [HSiO$_{3/2}$]. That is, it may be free of detectable hydroxyl-substituted T units of formula [HOSiO$_{3/2}$] and/or Q units of formula [SiO$_{4/2}$] based on $^{29}$Si-NMR.

Aspect 12. The method of making of aspect 11 wherein the contacting further comprises a hydrocarbon solvent or a halohydrocarbon solvent.

Aspect 13. The method of making of aspect 12 wherein the hydrocarbon or halohydrocarbon solvent is exchanged for 1,2-propylene glycol monomethyl ether mono acetate (PGMEA) to give a mixture of the silsesquioxane resin of formula (I) in PGMEA. In some aspects the mixture contains some remaining amount of the hydrocarbon or halohydrocarbon solvent. In some such aspects the mixture contains from >0 to <1 wt % hydrocarbon or halohydrocarbon solvent; alternatively from >0 to <10 part per million (ppm) hydrocarbon or halohydrocarbon solvent; alternatively from >0 to <1 part per million (ppm) hydrocarbon or halohydrocarbon solvent. In other aspects the mixture is free of the hydrocarbon or halohydrocarbon solvent.

Aspect 14. A composition comprising constituents (A) and (B): (A) the silsesquioxane resin of any one of aspects 1 to 10 and (B) at least one additional constituent.

In some aspects the at least one additional constituent is a photoacid generator (PAG) and the composition comprises a chemically-amplifiable photoresist composition. The chemically-amplifiable photoresist composition is useful for forming a photoresist layer of a first resist article comprising the photoresist layer disposed on a patternable substrate. A pattern suitable for making integrated circuits (ICs) may be formed in the photoresist layer such as by mask-exposing the photoresist layer to ultraviolet (UV) light. The UV light may contain an effective wavelength from 13 to 365 nanometers (nm), e.g., 365 nm, 248 nm (KrF), 193 nm (ArF), 157 nm (F2), or 13 nm (extreme ultraviolet light (EUV)). The chemically-amplifiable photoresist composition enables forming finer patterns and circuits. The chemically-amplifiable photoresist composition comprises the (A) the silsesquioxane resin of formula (I), which functions as a photoresist polymer that is acid sensitive, and a small amount of the PAG, which is light sensitive. The (A) the silsesquioxane resin of formula (I) comprises macromolecular chains that bear pendant acid-sensitive groups, sometimes called acid dissociable groups, acid cleavable groups, or acid labile groups. These acid-sensitive groups include the $R^1$ groups in formula (I) and, when present, the $R^2$ and/or $R^3$ groups in formula (I). The photoacid generator (PAG) itself is not an acid, but the PAG is a compound that absorbs light of a certain wavelength and produces a product acid in situ. The product acid reacts with the acid-sensitive groups of the nearby (A) the silsesquioxane resin of formula (I). Thus the (A) the silsesquioxane resin of formula (I) (a photoresist polymer) in the presence of the PAG is indirectly light sensitive. The composition, including the chemically-amplifiable photoresist composition, may be further formulated with one or more optional additives, described later, that enhance desirable properties or inhibit undesirable properties of the composition.

In some aspects the composition is an etching mask composition. The etching mask composition is useful for forming an etching mask layer of a second resist article comprising a photoresist layer, a patternable substrate, and the etching mask layer sandwiched between the photoresist layer and the patternable substrate. The photoresist layer of the second resist article may be an inventive photoresist layer comprising the silsesquioxane resin of formula (I), alternatively a non-invention photoresist material that enables a photoresist pattern to be formed therein. Any non-invention photoresist material is suitable, including an organic photoresist material or a non-invention polyorganosiloxane photoresist material. When the photoresist layer and the etching mask layer of the second resist article both comprise the silsesquioxane resin of formula (I), the silsesquioxane resin of formula (I) of the photoresist layer may be the same as or different than the silsesquioxane resin of formula (I) of the etching mask layer.

In some aspects the composition is a chemically-amplifiable photoresist and an etching mask composition.

The composition may be prepared by synthesizing the (A) silsesquioxane resin of any one of aspects 1 to 10 in the presence of, or producing as a by-product from, the (B) at least one additional constituent.

Alternatively, the composition may be prepared by together mixing together the (A) silsesquioxane resin of any one of aspects 1 to 10 and the (B) at least one additional constituent. When prepared by mixing, the composition may be prepared as a formulation for use in a particular application such as a coating, sealing, or photolithography application. The formulation may be a 1-part formulation or a multiple part formulation such as a 2-part formulation. The formulations may be formulated as 1-part formulations or as multi-part formulations such as a 2-part formulations. The constituents of the formulations may be mixed together by any suitable means such as by mechanically agitating them together such as by shaking or stirring. The formulations may be packaged as such along with instructions for their use in a particular application such as photolithography. The multi-part formulations may be packed in multiple packages and the instructions may further include directions for combining the different parts prior to use in a particular application.

The composition may be prepared as a manufactured article comprising the composition. The manufactured article may consist of a shaped form of the composition. The shaped form may regular or irregular. Examples include a free-standing film, block, and a plurality of particles.

Aspect 15. A manufactured article comprising the silsesquioxane resin of any one of aspects 1 to 10 or the composition of aspect 14 and a substrate. In some aspects the manufactured article comprises the first resist article or the second resist article described earlier. In some aspects the manufactured article is an opto/electronic device, alternatively a semiconductor device, and the substrate is a patternable substrate such as a semiconductor material or an electrically conductive metal. The silsesquioxane resin and composition may be used in an opto/electronic device comprising an opto/electronic component and the silsesquioxane resin or composition, respectively. The opto/electronic component may be an optical component, an electronic component, or a combination optical and electronic component. The silsesquioxane resin or composition may be disposed in direct or indirect contact with the opto/electronic component. In some embodiments the manufactured article is a resist article comprising a photoresist layer comprising the silsesquioxane resin of any one of aspects 1 to 10 or the composition of aspect 14 disposed on the patternable substrate. In some embodiments the resist article is configured in such a way that the photoresist layer is disposed directly on the patternable substrate. In other embodiments resist article is configured in such a way as to further comprise at least one intervening layer sandwiched between the photoresist layer and the patternable substrate. In such embodiments the at least one intervening layer and the resist article in which it is comprised may be an etching mask layer, which is physically distinct from the photoresist layer and which may or may not contain the silsesquioxane resin of formula (I). In other embodiments the at least one intervening layer and the resist article in which it is comprised is free of a physically distinct etching mask layer, although the photoresist layer may also function as an etching mask layer.

Any one of the foregoing numbered aspects wherein subscript o is 0, subscript q is 0, or both subscript o is 0 and subscript q is 0. Any one of aspects 1 to 13 wherein subscript o is >0 to 0.1, subscript q is >0 to 0.1, or both subscript o is >0 to 0.1 and subscript q is >0 to 0.1.

In some aspects the composition is free of polystyrene, —SH groups, and/or percarboxy groups (of divalent formula —C(=O)OO—). To remove all doubt, in some aspects the silsesquioxane resin of formula (I) is free of SH groups and/or percarboxy groups.

We present technical solutions to several problems. One technical solution provides a new silsesquioxane resin of formula (I). The silsesquioxane resin of formula (I) may be used in photolithographic applications and non-photolithographic applications such as adhesives, coatings, encapsulants, and sealants. The silsesquioxane resin of formula (I) may be used in opto/electronic devices and non-optical/non-electronic devices such as building materials.

Another technical solution provides a new composition comprising the silsesquioxane resin of formula (I) and at least one additional constituent. The composition may be used in photolithographic applications and non-photolithographic applications such as adhesives, coatings, encapsulants, and sealants. The composition may be used in opto/electronic devices and non-optical/non-electronic devices such as building materials.

Another technical solution provides a chemically-amplifiable photoresist composition comprising the silsesquioxane resin of formula (I) and a photoacid generator (PAG). The chemically-amplifiable photoresist composition may be used to form a photoresist layer, including the photoresist layer of the first and second resist articles.

Another technical solution provides an etching mask composition comprising the silsesquioxane resin of formula (I). The etching mask composition may further comprise a PAG, and also function as the chemically-amplifiable photoresist composition. The etching mask composition may be used to form an etching mask layer, including the etching mask layer of the first and second resist articles. Beneficially, the etching mask layer is not completely etched away in a first or second etching step (post-photopatterning). Upon being exposed to etching conditions, the etching mask layer enables a photoresist pattern to be anisotropically transferred via a first etching step from the photoresist layer into the etching mask layer, and then via a second etching step from the etching mask layer into the patternable substrate. The first and/or second etching step(s) may be the same or different and may independently comprise plasma etching or reactive-ion etching such as deep reactive-ion etching. The etching uses an etchant to form the plasma or reactive ions. The etchant may comprise molecular oxygen for use in plasma etching or a halocarbon such as tetrachloromethane or trifluoromethane for reactive-ion etching. The photoresist pattern is transferred downward into the etching mask layer, and then into the patternable substrate before the etching mask layer pattern is laterally undercut or etched away by the harsh etching environment. The silsesquioxane resin of formula (I) enables the etching mask layer to not be so resistant to etching that the photoresist pattern will not be transferred downward thereinto or into the patternable substrate. The silsesquioxane resin of formula (I) also enables the etching mask layer to be resistant enough to lateral etching during the etching step such that the etching mask layer will not be laterally undercut or completely etched away before the pattern can be transferred downward from the photoresist layer into the patternable substrate.

Still another technical solution comprises a new silsesquioxane resin of formula (I) that provides a silsesquioxane resin functionalized with pendant acid-sensitive groups, particularly pendant acid-sensitive organic groups, and yet has a silicon atom content of greater than 23 wt %, even as high as 42 wt %. Silicon atom content is equal to the total weight of all silicon atoms as a percentage of the total weight of the silsesquioxane resin. Silicon atom content may be determined by nuclear magnetic resonance (NMR) such as $^{29}$Si-NMR or by X-ray fluorescence (XRF) spectroscopy. Using $^{29}$Si-NMR distinct resonances may be readily distinguished in the spectra for each of the units $[HSiO_{3/2}]$ and $[R^1SiO_{3/2}]$, plus any of the optional units $[R^2SiO_{3/2}]$, $[R^3SiO_{3/2}]$, $[HOSiO_{3/2}]$, and $[SiO_{4/2}]$ that may be present in the silsesquioxane resin formula (I). The integration values for the respective resonances for the respective units may be measured to give relative mole fraction values for subscripts h and b, plus any subscripts n, v, o, and q, respectively, and thus for their respective units $[HSiO_{3/2}]$ and $[R^1SiO_{3/2}]$, plus any of the optional units $[R^2SiO_{3/2}]$, $[R^3SiO_{3/2}]$, $[HOSiO_{3/2}]$, and $[SiO_{4/2}]$. Mass values (grams) for each of the units may be calculated from their unit formulas, and then proportionally averaged using the mole fraction values for subscripts h and b, plus any subscripts n, v, o, and q, respectively, to give an average unit mass value. Since each unit has 1 Si atom, the atomic weight of silicon atom (28.086 g) divided by the average unit mass value, expressed as a percent, gives the wt % Si in the silsesquioxane resin of formula (I).

The composition comprises constituents (A) and (B): (A) silsesquioxane resin of formula (I) and (B) at least one additional constituent.

Constituent (A): the silsesquioxane resin of formula (I). The (A) silsesquioxane resin of formula (I) is typically present in the composition at a concentration of from 20 to 99.9 weight percent (wt %) based on total weight of the composition.

Constituent (B): the at least one additional constituent. The (B) at least one additional constituent is typically present in the composition at a concentration from 0.01 part to 400 parts, alternatively from 100 to 400 parts, alternatively from 0.01 to 100 parts, alternatively from 0.01 to 50 parts, all based on 100 parts of the (A) silsesquioxane resin. When the (B) at least one additional constituent is a (B1) photoacid generator (PAG), the composition is the chemically-amplifiable photoresist composition and the (B1) PAG is typically present therein at a concentration from 0.01 part to 5 parts, alternatively from 0.05 part to 4 parts, alternatively from 0.07 part to 3 parts, alternatively from 0.09 part to 2 parts, all per 100 parts of the (A) silsesquioxane resin.

Constituent (B1): photoacid generator (PAG).

The photoresist composition comprises one or more (B1) photoacid generator. The (B1) photoacid generator ("PAG") comprises any compound that is not an acid (not a Brønsted or Lewis acid), but that generates an acid upon exposure to electromagnetic radiation. Thus, a PAG functions as a pro-acid, which is a compound that undergoes a photochemical transformation before exhibiting acidic effects. In some aspects the PAG is an onium salt, a halogen-containing compound, a diazoketone compound, a sulfone compound, a sulfonate compound, or a combination of any two or more of the onium salt, halogen-containing compound, diazoketone compound, glyoxime derivative, sulfone compound, and sulfonate compound. Other useful photoacid generators include those mentioned in U.S. Pat. No. 7,261,992 B2, at column 10, line 57, to column 11, line 9. These include nitrobenzyl esters and s-triazine derivatives, such as the s-triazine derivatives mentioned in U.S. Pat. No. 4,189,323.

Onium Salts: Examples of onium salts suitable for use as the (B1) PAG are iodonium salts, sulfonium salts (including tetrahydrothiophenium salts), phosphonium salts, diazonium salts, and pyridinium salts. Specific examples of onium salts suitable for use as the (B1) PAG are listed in U.S. Pat. No. 8,729,148 B2, at column 14, line 40, to column 15, line 4, and tri(4-(4'-acetylphenylthio)-phenyl)sulfonium tetrakis (pentafluorophenyl)borate.

Halogen-containing Compounds: Examples of halogen-containing compounds suitable for use as the (B1) PAG are haloalkyl group-containing hydrocarbon compounds, and haloalkyl group-containing heterocyclic compounds. Specific examples of halogen-containing compounds suitable for use as the (B1) PAG are (trichloromethyl)-s-triazine derivatives such as phenylbis(trichloromethyl)-s-triazine, 4-m ethoxyphenylbis(trichloromethyl)-s-triazine, and 1-naphthylbis(trichloromethyl)-s-triazine, and 1,1-bis(4'-chlorophenyl)-2,2,2-trichloroethane.

Diazoketone Compounds: Examples of diazoketone compounds suitable for use as the (B1) PAG are diazomethane derivatives listed in U.S. Pat. No. 8,729,148 B2, at column 15, lines 4 to 23; 1,3-diketo-2-diazo compounds, diazobenzoquinone compounds, and diazonaphthoquinone compounds. As specific examples of diazoketone compounds suitable for use as the PAG are 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4'-hydroxyphenyl)ethane.

Glyoxime Derivatives: Examples of glyoxime derivatives suitable for use as the (B1) PAG are listed in U.S. Pat. No. 8,729,148 B2, at column 15, lines 23 to 46.

Sulfone Compounds: Examples of sulfone compounds suitable for use as the (B1) PAG are β-ketosulfone, β-sulfonylsulfone, and α-diazo compounds of these compounds. Specific examples of sulfone compounds are 4-trisphenacylsulfone, mesitylphenacylsulfone, and bis(phenylsulfonyl)methane.

Sulfonate Compounds: Examples of sulfonate compounds suitable for use as the (B1) PAG are alkyl sulfonate, alkylimide sulfonate, haloalkyl sulfonate, aryl sulfonate, and imino sulfonate. Specific examples of sulfonate compounds suitable for use as the (B1) PAG are benzointosylate, pyrogallol tris(trifluoromethanesulfonate), nitrobenzyl-9,10-diethoxyanthracene-2-sulfonate, trifluoromethanesulfonylbicyclo[2.2.1] hept-5-ene-2,3-dicarbodiimide, N-hydroxysuccinimidetrifluoromethanesulfonate, and 1,8-naphthalenedicarboxylic acid imido trifluoromethanesulfonate.

In some embodiments the (B1) photoacid generator is diphenyliodoniumtrifluoromethanesulfonate, bis(4-t-butylphenyl)iodonium trifluoromethanesulfonate, bis(4-t-butylphenyl) iodonium nonafluoro-n-butanesulfonate, triphenylsulfonium trifluoromethanesulfonate, triphenylsulfonium nonafluoro-n-butanesulfonate, cyclohexyl-2-oxocyclohexylimethylsulfonium trifluoromethane sulfonate, dicyclohexyl-2-oxocyclohexylsulfonium trifluoromethanesulfonate, 2-oxocyclohexyldimethylsulfoniuni trifluoromethanesulfonate, 4-hydroxy-1-naphthyldimethylsulfonium trifluorornethanesulfonate, 4-hydroxy-1-naphthyltetrahydrothiophenium trifluoromethanesulfonate, 1-(1'-naphthylacetomethyl) tetrahydrothiophenium trifluoromethanesulfonate, trifluoromethanesulfonylbicyclo[2.2.1]hept-5-ene-2,3-dicarbodiimide, N-hydroxysuccinimidetrifluoromethanesulfonate, or 1,8-naphthalenedicarboxylic acid imido trifluoromethanesulfonate.

In some embodiments, the silsesquioxane-containing composition and/or the photoresist composition independently further comprises one or more constituents (also called "additives"): (C) an acid-diffusion controlling agent (also called a quencher or base quencher), (D) a solvent, (E) an adhesion promoter, (F) a dye, (G) a halation inhibitor, (H) a plasticizer, (I) a sensitizer, (J) a stabilizer (e.g., storage stabilizer), and (K) a surfactant. Additives (D) to (K) are optional. In some embodiments the silsesquioxane-containing composition and/or the photoresist composition is free of (lacks) additives (D) to (K). In other embodiments the silsesquioxane-containing composition and/or the photoresist composition independently further comprises at least 1, alternatively at least 2, alternatively 3 or more of additives (D) to (K). In some embodiments the silsesquioxane-containing composition further comprises the (D) solvent, the (E) adhesion promoter, or both (D) and (E).

(C) Acid-diffusion controlling agent: In some embodiments the composition (e.g., the chemically-amplifiable photoresist composition) is free of (lacks or not added) (C) acid-diffusion controlling agent. In some embodiments the composition (e.g., the chemically-amplifiable photoresist composition) further comprises one or more (C) acid-diffusion controlling agent. The (C) acid-diffusion controlling agent may be used in the photoresist composition to inhibit excursion of the acid generated from (C) photoacid generator after exposure of areas of the chemically-amplifiable photoresist composition outside the exposed areas. The (C) acid-diffusion controlling agent may be an aprotic organic base that does not form a covalent bond with a carboxylic anhydride. Examples of (C) acid-diffusion controlling agent are tertiary amines; the examples of the basic compounds found in paragraphs [0306 to 0315] of US 2003/0017415 A1; and the organic base additive mentioned in U.S. Pat. No. 8,148,043 B2 to S. Hu, et al. Examples of constituent (C) are tertiary arylamines such as 2-(2-amino-phenyl)-isoindole-1,3-dione; 1-(2-((1H-1,2,3-benzotriazol-1-ylmethyl)amino) phenyl)ethanone; 1-((2,3-dimethyl-phenylamino)-methyl)-pyrrolidine-2,5-dione; 1-(2-methyl-4-phenylamino-3,4-dihydro-2H-quinolin-1-yl)-heptan-1-one; 2-((3-fluoro-4-methyl-phenylamino)-methyl)-phenol and N,N-diethylaniline. When present in the composition (e.g., the chemically-amplifiable photoresist composition), the (C) acid-diffusion controlling agent may be at a concentration of from 0.01 wt % to 10 wt %, based on total weight of the composition (e.g., the chemically-amplifiable photoresist composition). For example, 0.10 part of (C) acid-diffusion controlling agent may be used per 100 parts of constituent (A) silsesquioxane resin of formula (I).

(D) Solvent: In some embodiments the composition (e.g., the chemically-amplifiable photoresist composition) is free of (lacks or not added) (D) solvent. In some embodiments the composition (e.g., the chemically-amplifiable photoresist composition) further comprises one or more (D) solvent. The (D) solvent may be used to dissolve, disperse, or dilute the other constituents of the composition to give a mixture that can be more easily coated on a substrate in need of coating. Examples of such substrates for the chemically-amplifiable photoresist composition are a semiconductor wafer or metal wafer, or an underlayer (e.g., antireflective coating (ARC), etching mask layer, or a hardcoat layer) of a multilayer photoresist sequentially comprising the substrate, the underlayer, and the coating of the composition (photoresist layer). The underlayer is disposed (sandwiched") between the photoresist layer and the substrate. Examples of (D) solvent are methyl ethyl ketone (MEK), methyl isobutyl ketone (MIBK), 2-heptanone, methyl pentyl ketone (MAK), cyclopentanone, cyclohexanone, lactate alkyl esters like ethyl lactate, 1,2-propylene glycol monomethyl ether monoacetate (PGMEA), alkylene glycol monoalkyl esters, butyl acetate, 2-ethoxyethanol, and ethyl 3-ethoxypropionate. When present in the composition, the (D) solvent may be at a concentration of from 50 wt % to 90 wt %, based on total weight of the composition.

(E) Adhesion promoter: In some embodiments the composition (e.g., the chemically-amplifiable photoresist composition) is free of (lacks or not added) (F) adhesion promoter. In some embodiments the composition (e.g., the chemically-amplifiable photoresist composition) further comprises one or more (F) adhesion promoter. The (F)

adhesion promoter may be used to enhance bonding of the composition to a substrate in need of patterning, such as a semiconductor wafer (e.g., silicon wafer) or a metal surface. The (F) adhesion promoter may also be used to enhance bonding to an underlayer of a multilayer resist, e.g., an underlayer such as an ARC, etching mask layer, or a hardcoat layer. Examples of (F) adhesion promoter are a silane coupling agent such as commercially available silane coupling agents. Silane coupling agents typically contain a functionalized alkyl group, plus three alkoxy groups or two alkoxy groups and an alkyl group, all bonded to the same silicon atom. The functionalized alkyl group may be an aminoalkyl group, an epoxy-alkyl group, an acryloxyalkyl group, a methacryloxyalkyl group, a ureidoalkyl group, an isocyanuratoalkyl group, a mercapto alkyl group, or an alkenyl group. Examples include vinyltrimethoxysilane, 2-(3,4-epoxycyclohexyl)ethyl-trimethoxysilane, and 3-glycidoxypropyl trimethoxysilane. When present in the silsesquioxane-containing composition (e.g., the photoresist composition), the (F) adhesion promoter may be at a concentration of from 0.01 wt % to 5 wt %, based on total weight of the composition.

(F) Dye: The (F) dye, when added to or included in the composition, may be used to adjust optical density of the composition (e.g., the chemically-amplifiable photoresist composition).

(G) Halation inhibitor: The (G) halation inhibitor, when added to or included in the composition, may be used to prevent spreading of the lithographic radiation (light) beyond borders of the directly exposed areas of a photoresist layer of the chemically-amplifiable photoresist composition.

(H) Plasticizer: The (H) plasticizer, when added to or included in the composition, may be used to adjust viscosity of the composition (e.g., the chemically-amplifiable photoresist composition) to enhance its handleability or coatability.

(I) Sensitizer The (I) sensitizer, when added to or included in the composition, may be used to enhance activity of the (B1) photoacid generator by absorbing radiation at a first wavelength, and emitting radiation at a second wavelength transferring the emitted radiation to the (B1) photoacid generator, wherein the first and second wavelengths may be the same or different.

(J) Stabilizer: The (J) stabilizer, when added to or included in the composition, may be used to prolong shelf-life of the composition (e.g., the chemically-amplifiable photoresist composition), such as by inhibiting oxidative, acid-base, or other degradation reactions therein.

(K) Surfactant: The (K) surfactant, when added to or included in the composition, may be used to improve uniformity of a coating of the composition (e.g., the chemically-amplifiable photoresist composition) on a substrate such as a semiconductor wafer or an underlayer (e.g., ARC, etching mask layer, or hardcoat layer) of a multilayer photoresist.

The composition and the chemically-amplifiable photoresist composition embodiments thereof may contain other or additional optional additives as constituents. The total concentration of all constituents in the composition, including the chemically-amplifiable photoresist composition is 100%.

In some embodiments the composition is the chemically-amplifiable photoresist composition. The chemically-amplifiable photoresist composition may be protected from light having a wavelength shorter than 365 nm until after the chemically-amplifiable photoresist composition has been coated on a substrate and is ready to be masked-irradiated.

For example, the chemically-amplifiable photoresist composition may be prepared and coated under an environment consisting essentially of yellow light or red light. After being exposed to light (masked-irradiated), the chemically-amplifiable photoresist composition is converted to a chemically-amplified photoresist composition comprising initially an acid-sensitive photoresist polymer and a product acid. The product acid facilitates cleavage of the acid-sensitive groups of the acid-sensitive photoresist polymer to give a product polymer comprising macromolecular chains that bear pendant acidic groups. The rate of cleavage may be increased by heating the chemically-amplified photoresist composition. After cleavage, the chemically-amplified photoresist composition comprises the product acid and the product polymer. The acid-sensitive photoresist polymer, the PAG, the product acid, and the product polymer are different and distinct compounds.

When a portion of the chemically-amplifiable photoresist composition is exposed to light and another portion of the chemically-amplifiable photoresist composition is not exposed to light, a composite material is formed comprising a non-exposed region comprising the chemically-amplifiable photoresist composition (unreacted) and a light-exposed region comprising the chemically-amplified photoresist composition (cleavage products). When the chemically-amplifiable photoresist composition is restricted in one dimension and the light exposure is done through a photomask defining a pattern, the composite material is formed in the shape of a sheet or film having a non-exposed region and a patterned light-exposed region, which defines a latent pattern of the chemically-amplified photoresist composition. When the chemically-amplifiable photoresist composition is free of a crosslinker that is reactive with the product polymer, a positive resist image may be formed from the latent pattern by developing the sheet or film of the composite material with a developer (e.g., basic solution such as an aqueous base). The developer selectively dissolves the light-exposed region without dissolving the non-exposed region, thereby producing the positive resist image, which is defined by the remaining non-exposed region.

Developer solutions useful for removing the chemically-amplified photoresist composition (light-exposed region) include aqueous solutions comprising water and a base. The base is a chemical compound that is soluble in deionized water to give an aqueous solution having a potential of hydrogen (pH) >7. This basic chemical compound may be an inorganic chemical compound such as ammonia or a Group 1 or 2 metal hydroxide or carbonate. Alternatively, the basic chemical compound may be an organic chemical compound such as an amine or a basic nitrogen-containing heterocycle. Examples of the base are tetramethylammonium hydroxide (TMAH), choline, sodium hydroxide, potassium hydroxide, sodium carbonate, sodium silicate, sodium metasilicate, ammonia, ethylamine, propylamine, diethylamine, dipropylamine, triethylamine, methyldiethylamine, ethyldimethylamine, triethanolamine, pyrrole, piperidine, 1,8-diazabicyclo[5.4.0]-7-undecene, and 1,5-diazabicyclo[4.3.0]-5-nonene. When the chemically-amplifiable photoresist composition is formulated for use as a positive photoresist, the exposed areas of a photoresist layer thereof will become soluble in the developer solution and the unexposed areas will be (remain) insoluble in the developer solution. Once the exposed photoresist layer (positive photoresist) has been developed with developer solution, the undissolved remainder of the photoresist layer ("pattern") may be washed with water to remove excess developer solution therefrom.

The developer is different than the (B) at least one additional constituent in structure, formulation, function or use, and/or amount. When the basic chemical compound of the developer is an amine, it typically is an unsubstituted alkyl-containing amine. Further, the developer typically is a solution of the basic chemical compound in water, whereas the composition is substantially free of water (e.g., has from 0 wt % to less than 1 wt % water). Also, the developer is used in the developing step to selectively dissolve the mask exposed region of the mask exposed film of the photoresist composition, while not dissolving the unexposed region of the film. The product acid is formed in situ from the (B1) photoacid generator upon exposure of the (B1) photoacid generator of the mask exposed region of the film of the photoresist composition to radiation in the mask exposing step. The basic chemical compound is typically present in the developer at a concentration of from 1 to 5 wt %.

The pattern may then be transferred to an underlying substrate. In bilayer photoresists, the transferring comprises transferring the pattern through the underlayer (e.g., ARC, etching mask layer, or hardcoat layer) onto the substrate (e.g., silicon or metal). In single layer photoresist, there is no underlayer and the pattern is transferred directly onto the substrate. Typically, the pattern is transferred via etching with reactive ions such as oxygen, plasma, or oxygen/sulfur dioxide plasma. Etching methods are well known in the art.

Another embodiment is a process for generating a resist image on a substrate or on an underlayer disposed on a substrate. In some embodiments the process comprises the steps of: (a) coating a substrate with the chemically-amplifiable photoresist composition comprising constituents (A) to (B), and typically also constituent (D) solvent, and optionally constituent (C) base quencher, to form a resist-coated substrate comprising an applied film of the chemically-amplifiable photoresist composition on the substrate; (b) mask exposing (imagewise exposing) the applied film to, or mask irradiating with, radiation (e.g., 248 nm, 193 nm, or 157 nm) to produce a mask-irradiated resist comprising an exposed film containing a latent pattern; and (c) developing the exposed film of the mask-irradiated resist to produce a resist image from the latent pattern to give a developed resist. The developed resist is a manufactured article comprising the resist image disposed on the substrate. In other embodiments the process comprises the steps of: (a) coating an underlayer, which is predisposed on a substrate, with a resist composition comprising constituents (A) to (B), and typically also constituent (D) solvent, and optionally constituent (C) base quencher, to form a bilayer on the substrate, wherein the bilayer comprises an applied film of the chemically-amplifiable resist composition disposed on the underlayer; (b) mask exposing (imagewise exposing) the applied film to radiation to produce an exposed film containing a latent pattern; and (c) developing the exposed film to produce a resist image from the latent pattern to give a manufactured article comprising the resist image disposed on the substrate.

Suitable substrates are ceramic, metallic or semiconductive, and preferred substrates are silicon-containing, including, for example, silicon dioxide, silicon nitride, silicon oxynitride, silicon carbide, and silicon oxycarbide.

The underlayer may be an etching mask layer, a hardcoat layer (e.g., an organic hardcoat layer) or an anti-reflective coating (ARC). The etching mask layer may be comprise the silsesquioxane resin of formula (I). The underlayer is formed on the substrate prior to the coating step of forming the film of the resist composition. The underlayer may be composed of a material that is highly light absorbing at the imaging wavelength used in the mask exposing step and is chemically compatible with the chemically-amplifiable resist composition. Typical underlayer materials other than the silsesquioxane resin of formula (I) are crosslinked poly(4-hydroxystyrene), polyesters, polyacrylates, polymethacrylates, fluorinated polymers, and cyclic-olefin polymers. E.g., diazonapthoquinone (DNQ) or novolak.

Prior to step (a) coating, typically, the surface of the underlayer or the substrate, as the case may be, is cleaned before the chemically-amplifiable resist composition is applied (e.g., coated) thereon. Suitable cleaning procedures are known in the art. The chemically-amplifiable resist composition may be coated on the underlayer or directly on the substrate, as the case may be, using techniques such as spin-coating, spray coating, or doctor blading. Typically, the resist film comprises the (D) solvent and is dried (soft baked) before the applied film (after drying) is exposed to radiation in the mask exposing step. The drying or soft baking step may comprise heating the resist film to a temperature in the range of 30° to 200° C., typically from 80° to 140° C., for a short period of time (e.g. 20 to 90 seconds), typically on the order of approximately 1.0 minute. The resulting dried film has a thickness of 0.01 to 5.0 micrometers (μm), alternatively 0.02 to 2.5 μm, alternatively 0.05 to 1.0 μm, and alternatively 0.10 to 0.20 μm.

In step (b) mask exposing, the applied film (e.g., dried applied film) is exposed to radiation through a mask designed to create a latent pattern in the mask exposed film. The latent pattern is suitable for ultimately giving a patterned semiconductor device having a predetermined pattern. The radiation may be UV, X-ray, e-beam, or EUV. The EUV may have a wavelength of 13 nm. Typically, the radiation is UV radiation having a wavelength of 157 nm to 365 nm (e.g., 157 nm or 193 nm). Suitable radiation sources include mercury, mercury/xenon, and xenon lamps. A particular radiation source is a KrF excimer laser or a $F_2$ excimer laser. At longer wavelength radiation is used, e.g., 365 nm, a sensitizer may be included in the photoresist composition to enhance absorption of the radiation. Satisfactory exposure of the photoresist composition is typically achieved by irradiating the applied film with from 10 to <100 millijoules per square centimeter of surface area of the applied film ($mJ/cm^2$), alternatively from 10 to 50 $mJ/cm^2$ of radiation.

In the (b) mask exposing step, the radiation is absorbed by the (B1) photoacid generator in the mask exposed regions of the exposed film of the photoresist composition to generate a product acid in situ therein. After the chemically-amplifiable photoresist composition has been exposed to radiation, the resulting exposed film is typically heated to a temperature in the range of 30° C. to 200° C. for a short period of time, on the order of approximately 1 minute. When the chemically-amplifiable photoresist composition is a positive photoresist, the product acid causes cleavage of the acid dissociable groups (e.g., the $R^1$ group in formula (I)) of the (A) silsesquioxane resin that is present in the photoresist composition, thereby forming a latent pattern having developer-soluble regions in the exposed film.

In step (c) developing step, the exposed film is contacted with a suitable developer to produce a resist image from the latent pattern of the exposed film. The composition of the developer is described earlier. In the positive photoresist film, the exposed regions of the photoresist will be soluble in developer ("developer-soluble"), and the (c) developing step dissolves the exposed regions in the developer and leaves behind the unexposed regions of the exposed positive photoresist film in the form of a generated image or pattern.

After the exposed film has been developed and the generated image or pattern has been formed, typically the remaining resist film ("pattern") is washed with water to remove any residual developer.

The generated image or pattern obtained from step (c) and optional washing step may then be transferred directly into the substrate or through the underlayer into the substrate, as the case may be. Typically, the pattern is transferred by etching with reactive ions such as a molecular oxygen plasma and/or a molecular oxygen/sulfur dioxide plasma. Suitable techniques and machines for forming the plasma include systems such as electron cyclotron resonance (ECR), helicon, inductively coupled plasma, (ICP) and transmission-coupled plasma (TCP).

Thus the chemically-amplifiable photoresist composition may be used in the foregoing photolithographic patterning method or process to manufacture patterned structures. Examples of patterned structures that can be made are metal wiring lines, holes or vias as conduits for electrical contacts, insulation sections (e.g., damascene trenches or shallow trench isolation), trenches for capacitor structures, and other structures that may be used to manufacture integrated circuit devices.

Some embodiments include a resist-coated wafer comprising a layer of the chemically-amplifiable photoresist composition disposed on a semiconductor wafer. The chemically-amplifiable photoresist composition may be directly contacting the semiconductor wafer or the resist-coated wafer may further comprise an underlayer disposed between the layer of the photoresist composition and the semiconductor wafer. The underlayer may be formed by coating the semiconductor wafer with an underlayer composition. The underlayer composition may comprise the silsesquioxane resin of formula (I). The semiconductor wafer may be a bare wafer when it is coated with the chemically-amplifiable photoresist composition or the underlayer composition, as the case may be. Alternatively, the semiconductor wafer may be a primed wafer made by pre-treating a bare semiconductor wafer with a primer. The pre-treating may comprise chemical vapor deposition of a primer. The primer may comprise any compound effective for enhancing adhesion of the photoresist layer or the underlayer, as the case may be, to the semiconductor wafer. For example, the primer compound may be hexamethyldisilazane.

Some embodiments include a soft baked wafer prepared by heating the resist coated wafer for a brief period of time (e.g., 30 to 120 seconds, e.g., 45 to 90 seconds, or 50 to 70 seconds, e.g., 60 seconds) at a temperature of from 80° to 140° C. (e.g., 90° to 120° C., e.g., 100° or 110° C.). The soft baked wafer comprises a soft baked resist layer disposed on the semiconductor wafer or on an underlayer, which is disposed on the semiconductor wafer.

Some embodiments include a masked-irradiated wafer prepared by exposing the resist coated wafer or the soft baked wafer to radiation including, e.g., 248 nm, 193 nm, 157 nm using a dose of from 10 to 75 millijoules per square centimeter (mJ/cm$^2$) surface area of the resist-coated wafer or soft baked wafer. In some embodiments the radiation is dosed at from 15 to 55 mJ/cm$^2$, alternatively from 20 to 50 mJ/cm$^2$, alternatively from 23 to 45 mJ/cm$^2$. The masked-irradiated wafer comprises a masked-irradiated resist layer disposed on the semiconductor wafer or on an underlayer, which is disposed on the semiconductor wafer. The masked-irradiated resist layer contains a latent pattern.

Some embodiments include a post-exposure baked wafer prepared by heating the masked-irradiated wafer for a brief period of time (e.g., 30 to 120 seconds, e.g., 45 to 90 seconds, or 50 to 70 seconds, e.g., 60 seconds) at a temperature of from 80° to 140° C. (e.g., 90° to 120° C., e.g., 100° or 110° C.). The post-exposure baked wafer comprises a post-exposure baked resist layer disposed on the semiconductor wafer or on an underlayer, which is disposed on the semiconductor wafer. The post-exposure baked resist layer contains a latent pattern.

Some embodiments include a developed resist prepared by contacting the masked-irradiated wafer or the post-exposure baked wafer with a developer so as to remove some of the masked-irradiated resist material or some of the post-exposure baked resist material without removing other portions of the material so as to form a resist pattern or image. The developer may comprise an aqueous base solution for positive resist formulations of the photoresist composition. The positive resist formulation comprises constituents (A) to (C). The developed resist comprises a developed resist layer disposed on the semiconductor wafer or on an underlayer, which is disposed on the semiconductor wafer. The developed resist layer contains a resist pattern or resist image. The resist pattern or image may contain vertical features having cross-section profiles characterized by Field Emission Scanning Electron Microscope (FE-SEM) as having rounded corner tops or squared corner tops.

Some embodiments include a rinsed resist prepared by rinsing excess developer from the developed resist. Excess developer may cling to the developed resist and may be removed by rinsing the developed resist with a rinsing agent such as a volatile organic solvent. The rinsed resist comprises a rinsed resist layer disposed on the semiconductor wafer or on an underlayer, which is disposed on the semiconductor wafer. The rinsed resist layer contains a resist pattern or resist image. The resist pattern or image may contain vertical features having cross-section profiles characterized by FE-SEM as having rounded corner tops or squared corner tops.

Some embodiments include an etched resist prepared by etching the developed resist or rinsed resist with an etching agent using an anisotropic etching technique. The etching agent may comprise a molecular oxygen plasma, a halogen plasma, or a sequential application of a molecular oxygen plasma followed by a halogen plasma. In some embodiments the etched resist is a molecular oxygen plasma etched resist. In other embodiments the etched resist is a halogen plasma etched resist. In other embodiments the etched resist is a sequential molecular oxygen plasma etched followed by halogen plasma etched resist. The molecular oxygen plasma etched resist comprises an etched resist layer disposed on the semiconductor wafer or on a molecular oxygen plasma etched underlayer, which is disposed on the semiconductor wafer. The halogen plasma etched resist layer contains a halogen plasma etched underlayer disposed on a patterned structure comprising a patterned semiconductor wafer. The molecular oxygen plasma etched underlayer or the halogen plasma etched underlayer may comprise the silsesquioxane resin of formula (I).

Some embodiments include a patterned structure prepared by removing the etched resist layer from the patterned semiconductor wafer.

This description has been written to intentionally such that any one stated feature or limitation of an example, any one stated Markush subgenus or species, or any one stated number of a range or subrange, may be relied upon and provides adequate support for amending the claims.

Unless otherwise defined herein, meanings of chemical technology terms used herein may be found in IUPAC. Compendium of Chemical Terminology, 2nd ed. (the "Gold Book"). Compiled by A. D. McNaught and A. Wilkinson. Blackwell Scientific Publications, Oxford (1997). XML on-line corrected version: http://goldbook.iupac.org (2006-) created by M. Nic, J. Jirat, B. Kosata; updates compiled by A. Jenkins. ISBN 0-9678550-9-8. doi:10.1351/goldbook. Terms not defined by IUPAC may be defined in Hawley's CONDENSED CHEMICAL DICTIONARY, 11th edition, N. Irving Sax & Richard J. Lewis, Sr., 1987 (Van Nostrand Reinhold).

Unless otherwise defined herein, meanings of general terms used herein may be found here. Alternatively precedes a distinct embodiment. Articles "a", "an", and "the" each refer to one or more. Average molecular mass of a polymer such as weight average molecular mass or "$M_W$" is determined using gel permeation chromatography (GPC) with polystyrene standards. Chemical element or atom, a Group or Groups of chemical elements shall mean those published by IUPAC in the Periodic Table of the Elements, version dated 1 May 2013. Any comparative example is used for illustration purposes only and shall not mean prior art. A synthesized product such as a synthesized silsesquioxane resin may have a structure that can be varied depending upon the particular reactants and synthesis conditions used to make it. That variability is not unlimited, but is restricted according to the structure of the reactants and synthesis chemistry and conditions. Formulation, one-part, means a mixture containing all the constituents and in proportions needed to produce a cured product. The one-part formulation may use external factors such as moisture (for condensation curing), heat (for addition curing), or light (for addition curing) to initiate, speed or complete the curing process. Formulation, two-part, means a system that segregates different reactive constituents into two separate and complementary divisions to prevent premature initiation of curing. For example, a monomer, prepolymer, or curable polymer, but not a catalyst, may be included in a primary part; and a cure catalyst, but not a monomer, prepolymer, or curable polymer, may be included in a secondary part. Initiation of curing is achieved by combining the primary part and the secondary part together to form a one-part formulation. Free of or lacks means a complete absence of; alternatively not detectable, e.g., using nuclear magnetic resonance (NMR) spectroscopy (e.g., $^1$H-NMR, $^{13}$C-NMR, or $^{29}$Si-NMR) or Fourier Transform-Infrared (FT-IR) spectroscopy. Invention and inventive shall mean a representative embodiment or aspect, and shall not be interpreted as constituting the entire invention. IUPAC is International Union of Pure and Applied Chemistry (IUPAC Secretariat, Research Triangle Park, North Carolina, USA). Markush group comprises a genus of two or more members. A Markush group of members A and B may be equivalently expressed as: "a member selected from A and B"; "a member selected from the group consisting of A and B"; or "a member A or B". Each member may independently be a subgenus or species of the genus. May confers a permitted choice, not an imperative. Operative means functionally capable or effective. Optional(ly) means is absent (or excluded), alternatively is present (or included). Properties are measured using a standard test method and conditions for the measuring (e.g., viscosity: 23° C. and 101.3 kPa). Ranges of numbers include endpoints, subranges, and whole and/or fractional values subsumed therein, except a range of integers does not include fractional values. Removing a component from a mixture of components does not include selectively derivatizing/reacting the component to form a derivative/product unless the derivative/product is physically separated from the other components of the mixture. Substituted means having, in place of hydrogen, one or more substituents, including per substitution. Each substituent may independently be a halogen atom, —NH$_2$, —NHR, —NR$_2$, —NO$_2$, —OH, —OR, oxo (=O), —C≡N, —C(=O)—R, —OC(=O)R, —C(=O)OH, —C(=O)OR, —SH, —SR, —SSH, —SSR, —SC(=O)R, —SO$_2$R, —OSO$_2$R, —SiR$_3$, or —Si(OR)$_3$; wherein each R independently is an unsubstituted (C$_1$-C$_{30}$)hydrocarbyl, alternatively (C$_1$-C$_6$)hydrocarbyl. Halogen atom is F, Cl, Br, or I; alternatively F, Cl, or Br; alternatively F or Cl; alternatively F; alternatively Cl. Each substituent may be aprotic, alternatively protic. Vehicle means a liquid acting as a carrier, dispersant, diluent, storage medium, supernatant, or solvent for another material, which may or may not be soluble therein.

Any compound herein includes all its isotopic forms, including natural abundance forms and isotopically-enriched forms. In some aspects, the isotopic form is the natural abundance form, alternatively the isotopically-enriched form. The isotopically-enriched forms may have additional uses, such as medical or anti-counterfeiting applications, wherein detection of the isotopically-enriched compound is helpful in treatment or detection.

In some aspects any composition described herein may contain any one or more of the chemical elements of Groups 1 to 18 of the Periodic Table of the Elements. In some aspects at least one such chemical element is specifically excluded from the composition, except not excluded are Si, O, H, C, N, F, Cl, Br, and I; alternatively Si, O, H, C, F, and Cl. In some aspects the specifically excluded chemical elements may be: (i) at least one chemical element from any one of Groups 2 to 13 and 18, including the lanthanoids and actinoids; (ii) at least one chemical element from any one of the third to sixth rows of the Periodic Table of the Elements, including the lanthanoids and actinoids; or (iii) both (i) and (ii), except not excluding Si, O, H, C, N, F, Cl, Br, or I.

The invention is further illustrated by, and an invention embodiment may include any combinations of features and limitations of, the non-limiting examples thereof that follow. Ambient temperature is about 23° C. unless indicated otherwise.

EXAMPLES

NMR: nuclear magnetic resonance (NMR) spectra were obtained on a Varian XL-400 MHz Mercury spectrometer with CDCl$_3$ as the solvent. Chemical shifts for $^1$H-NMR, $^{13}$C-NMR, and $^{29}$Si-NMR spectra were referenced to internal solvent resonance and are reported relative to tetramethylsilane.

GPC: gel permeation chromatography (GPC) analysis was conducted on a system comprising a Waters 600 pump, a Waters 717 autosampler, and a Waters 410 differential refractometer. Polystyrene standards were used.

HSQ Resin 1: a hydrogen silsesquioxane resin 1 (HSQ Resin 1) was synthesized via controlled hydrolysis of trichlorosilane (HSiCl$_3$) according to the procedure described in C. L. Frye; W. T. Collins, *J. Am. Chem. Soc.*, 1970; 92:5586.

Monomer M1: 3-butenoic acid 1,1-dimethylethyl ester was synthesized according to the procedure described in F. Orsini, *Synthetic Commun.*, 1982; vol. 12, no. 14, pp. 1147-1154.

Monomer M2: bicyclo[2.2.1]hept-2-ene-5-carboxylic acid 1,1-dimethylethyl ester was obtained from a commercial supplier.

Monomer M3: acrylic acid 1,1-dimethylethyl ester was obtained from a commercial supplier.

Photoacid Generator (B1-1): triphenylsulfonium hexafluorophosphate ($Ph_3S+PF_6-$; CAS Reg. No. [57840-38-7]) from Midori Kagaku Company, Limited.

Acid-diffusion controlling agent (C1): N,N-diethylaniline.

Comparative Example 1 (non-invention): Synthesis of a non-invention silsesquioxane resin of formula $T(H)_{0.63}T(m2)_{0.37}$, wherein repeat units T(H) are derived from HSQ Resin 1 and repeat units T(m2) are derived from HSQ Resin 1 and Monomer M2. To a 1 liter (L) three-necked flask were added 500 grams (g) of HSQ Resin 1 (20 wt % in toluene, 1.89 mole), Monomer M2 (135.6 g, 0.698 mole), and Pt catalyst (0.081 g, containing 24 wt % of Pt). The resulting mixture was heated and refluxed under nitrogen gas atmosphere for 3 hours to give a heated mixture of the silsesquioxane resin of Comparative Example 1. If desired the heated mixture may be cooled and filtered through a 0.2 micrometer (μm) poly(tetrafluoroethylene) filter to give a filtered PGMEA solution of 20 wt % of the silsesquioxane resin of Comparative Example 1.

Comparative Example 1a: Synthesis of silsesquioxane resin of formula $T(H)_{0.55}T(m2)_{037}T(OH)/0.07Q_{0.01}$. Subscripts do not add to 1.00 due to rounding. The mixture of Comparative Example 1 was cooled, and the toluene was exchanged out for PGMEA to give a 20 wt % PGMEA solution. The PGMEA solution was then filtered through a 0.2 μm filter to give a filtered PGMEA solution. GPC: Mw=6,510; PDI=2.53. $^{29}$Si-NMR spectrum was consistent with Si wt %=22.5 wt %.

Comparative Example 2 (non-invention): Attempted synthesis of a non-invention silsesquioxane resin of formula $T(H)_{0.63}T(m3)_{0.37}$, wherein repeat units T(H) would be derived from HSQ Resin 1 and repeat units T(m3) are of formula $-CH_2CH_2CO_2C(CH_3)_3$ and would be derived from HSQ Resin 1 and Monomer M3. Replicated the procedure of Comparative Example 1 except used Monomer M3 instead of Monomer M1. The procedure failed to give the silsesquioxane resin of formula $T(H)_{0.63}T(m3)_{0.37}$ because Monomer M3 was found to be unstable under hydrosilylation conditions such that the silsesquioxane resin of Comparative Example 2 did not contain an acid-dissociable group.

Example 1: Synthesis of silsesquioxane resin (A-1) of formula $T(H)_{0.65}T(m1)_{0.35}$, wherein repeat units T(H) are derived from HSQ Resin 1 and repeat units T(m1) are derived from HSQ Resin 1 and Monomer M1. To a 1 liter (L) three-necked flask were added 500 g of HSQ Resin 1 (20 wt % in toluene, 1.89 mole), Monomer M1 (94.1 g, 0.66 mole), and Pt catalyst (0.081 g, containing 24 wt % of Pt). The resulting mixture was heated and refluxed under nitrogen gas atmosphere for 12 hours to give a heated mixture of the silsesquioxane resin (A-1). If desired the heated mixture may be cooled and filtered through a 0.2 μm filter to give a filtered PGMEA solution of 20 wt % of the silsesquioxane resin (A-1).

Example 1a: Synthesis of silsesquioxane resin (A-1a) of formula $T(H)_{0.59}T(m1)_{0.35}T(OH)_{0.05}Q_{0.01}$. The mixture from Example 1 was treated with water, cooled, and the toluene was exchanged out for PGMEA to give a 20 wt % PGMEA solution. The PGMEA solution was then filtered through a 0.2 μm filter to give a filtered PGMEA solution of 20 wt % of the silsesquioxane resin (A-1a). GPC: Mw=13,200; PDI=3.89. $^{29}$Si-NMR spectrum was consistent with Si wt %=27.4 wt %.

Example 2: Synthesis of silsesquioxane resin (A-2) of formula $T(H)_{0.65}T(m1)_{0.25}T(m2)_{0.10}$, wherein repeat units T(H) are derived from HSQ Resin 1, repeat units T(m1) are derived from HSQ Resin 1 and Monomer M1, and repeat units T(m2) are derived from HSQ Resin 1 and Monomer M2. The procedure of Example 1 was replicated except a different amount of Monomer M1 was used (67.2 g, 0.47 mole) and an additional monomer, Monomer M2 (36.7 g, 0.19 mole), was also used to give a heated mixture of the silsesquioxane resin (A-1). If desired the heated mixture may be cooled and filtered through a 0.2 μm filter to give a filtered PGMEA solution of 20 wt % of the silsesquioxane resin (A-2).

Example 2a: Synthesis of silsesquioxane resin (A-2a) of formula $T(H)_{0.60}T(m1)_{0.25}T(m2)_{0.10}T(OH)_{0.04}Q_{0.01}$. The procedure of Example 1a was replicated to give a filtered PGMEA solution of 20 wt % of the silsesquioxane resin (A-2a). GPC: Mw=14,400; PDI=3.99. $^{29}$Si-NMR spectrum was consistent with Si wt %=26.1 wt %.

Example 3: Synthesis of silsesquioxane resin (A-3) of formula $T(H)_{0.65}T(m1)_{0.15}T(m2)_{0.20}$, wherein repeat units T(H) are derived from HSQ Resin 1, repeat units T(m1) are derived from HSQ Resin 1 and Monomer M1, and repeat units T(m2) are derived from HSQ Resin 1 and Monomer M2. The procedure of Example 1 was replicated except a different amount of Monomer M1 was used (40.3 g, 0.28 mole) and an additional monomer, Monomer M2 (73.1 g, 0.378 mole), was also used to give a heated mixture of the silsesquioxane resin (A-1). If desired the heated mixture may be cooled and filtered through a 0.2 μm filter to give a filtered PGMEA solution of 20 wt % of the silsesquioxane resin (A-3).

Example 3a: Synthesis of silsesquioxane resin (A-3a) of formula $T(H)_{0.56}T(m1)_{0.15}T(m2)_{0.20}T(OH)_{0.08}Q_{0.01}$. The procedure of Example 1a was replicated to give a filtered PGMEA solution of 20 wt % of the silsesquioxane resin (A-3a). GPC: Mw=8,830; PDI=3.06. $^{29}$Si-NMR spectrum was consistent with Si wt %=24.9 wt %.

Example A: film forming and etching. In separate experiments, the final resin solutions of Examples 2a and 3a were filtered through a 0.2 micrometer poly(tetrafluoroethylene) filter, and then the resulting filtrates were spin-coated onto silicon wafers (15.2 centimeters (6 inches) diameter) using a Karl Suss CT62 spin coater (spin speed=2000 revolutions per minute (rpm); acceleration speed=5000, time=20 seconds, all unless otherwise indicated) to each give a coated article comprising a spin-coated film on a silicon wafer. The coated articles (films) were pre-baked at 120° C. for 60 seconds using a rapid thermal processing (RTP) oven with a nitrogen gas purge. The thicknesses of the resulting pre-baked films were determined using a J. A. Woollam Ellipsometer, and recorded as the average of nine measurements. After that, the coated article was placed into an etching chamber (pressure=16 milliTorr (mT, 0.0021 kilopascals (kPa)); power=500-30 Watts (W); Gas: 80 N2/5 O2), and the coated wafers were subject to oxygen plasma etching. Thicknesses of the films after etching were measured, and the loss of thickness was determined relative to starting thickness. The thickness losses in angstroms (Å) are summarized in Table 1 below. In addition an organic novolak resin (0 wt % Si; organic hard mask: OHM) was used as a comparative, non-invention etching reference.

TABLE 1 thickness losses due to etching.

| Etching Time | Thickness Loss (Å) | | |
|---|---|---|---|
| (seconds) | Resin Ex. No. 2 | Resin Ex. No. 3 | novolak |
| 60 | 58 | 123 | 1,140 |
| 120 | 92 | 147 | 2,430 |
| 180 | 118 | 182 | 3,520 |
| 300 | 197 | 224 | 5,680 |
| 420 | 249 | 281 | 8,020 |
| 600 | 386 | 398 | 11,700 |

The etching rate after 600 seconds (s) and expressed in angstroms per second (Å/s) and corresponding selectivity over organic novolak resin for the films prepared from Comparative Example 1 and Examples 2a and 3a were calculated and are shown below in Table 2.

TABLE 2 etching rate after 600 seconds and selectivity over novolak.

| Resin Ex. No. | Etch rate (Å/sec.) | Selectivity over Novolak |
|---|---|---|
| Ex. 2a | 0.643 | 30 |
| Ex. 3a | 0.664 | 29 |
| Comp. Ex. 1a | 0.91 | 22 |
| novolak | 19.5 | 1.00 |

As shown by the data in Tables 1 and 2, the present technical solution provides a silsesquioxane resin that is resistant to etching and is suitable for use in or as an etching mask composition. The present silsesquioxane resin may be used to make the present composition. The present silsesquioxane resin or composition may be used as to form an etching mask layer. Embodiments of the silsesquioxane resin have achieved a silicon content of greater than 23 wt %, which outperformed a non-invention comparative example having a silicon content of 22.5 wt %. Comparative Example 1 ("Comp. Ex. 1") is made with Monomer M2, but not Monomer M1.

Examples B1, B2, and B3 (prophetic): preparation of a chemically-amplifiable photoresist composition. In three separate experiments, under yellow light is mixed photoacid generator (B1-1) with aliquots of a different 20 wt % filtered PGMEA solution of Example 1, 2, or 3 to give three mixtures. Use 1.00 part of photoacid generator (B1-1) per 100 parts of silsesquioxane resin of Example 1, 2, or 3. Each of the three mixtures is diluted with PGMEA to give chemically-amplifiable photoresist compositions B1, B2, or B3, respectively. Each composition contains 16 wt % of silsesquioxane resin of Example 1, 2, or 3, and the photoacid generator (B1-1) in PGMEA.

Examples B1a, B2a, and B3a (prophetic): preparation of a chemically-amplifiable photoresist composition. In three separate experiments, replicate the procedure of Examples B1, B2, and B3 except use the 20 wt % filtered PGMEA solution of Example 1a, 2a, or 3a instead of the 20 wt % filtered PGMEA solution of Example 1, 2, or 3, to give chemically-amplifiable photoresist compositions B1a, B2a, or B3a, respectively. Each composition contains 16 wt % of silsesquioxane resin of Example 1a, 2a, or 3a, and the photoacid generator (B1-1) in PGMEA.

Examples B1-1, B2-1, and B3-1 (prophetic): add a measured amount of acid-diffusion controlling agent (C1) to each of the compositions of Examples B1, B2, and B3 to give chemically-amplifiable photoresist compositions B1-1, B2-1, and B3-1, respectively. Each composition contains 16 wt % of silsesquioxane resin of Example 1, 2, or 3, the photoacid generator (B1-1), and 0.10 part of the acid diffusion controlling agent (C1) per 100 parts of the silsesquioxane resin, all in PGMEA.

Examples B1-1a, B2-1a, and B3-1a (prophetic): preparation of a chemically-amplifiable photoresist composition. In three separate experiments, replicate the procedure of Examples B1-1, B2-1, and B3-1 except use the 20 wt % filtered PGMEA solution of Example B1a, B2a, or B3a instead of the 20 wt % filtered PGMEA solution of Example B1, B2, or B3, to give chemically-amplifiable photoresist compositions B1-1a, B2-1a, or B3-1a, respectively. Each composition contains 16 wt % of silsesquioxane resin of Example 1a, 2a, or 3a, the photoacid generator (B1-1), and 0.10 part of the acid diffusion controlling agent (C1) per 100 parts of the silsesquioxane resin, all in PGMEA.

Examples C1, C2, C3, C1-1, C2-1, and C3-1 (prophetic): preparation of resist-coated wafers. In six separate experiments the chemically-amplifiable photoresist composition of Example B1, B2, B3, B1-1, B2-1, or B3-1 is filtered through a 0.10 μm polytetrafluoroethylene filter to give a corresponding filtrate, and the filtrate is spin-coated onto a different one of bare silicon wafers to give a resist-coated wafer of Example C1, C2, C3, C1-1, C2-1, or C3-1, respectively. ("Bare" means the silicon wafer did not contain an underlayer and was not pretreated with a primer.) Each resist-coated wafer comprised a resist layer disposed directly on the wafer. Each resist layer had a thickness of 5,000 angstroms (Å).

Examples C1a, C2a, C3a, C1-1a, C2-1a, and C3-1a (prophetic): preparation of resist-coated wafers. In six separate experiments the chemically-amplifiable photoresist composition of Example B1a, B2a, B3a, B1-1a, B2-1a, or B3-1a is filtered through a 0.10 μm polytetrafluoroethylene filter to give a corresponding filtrate, and the filtrate is spin-coated onto a different one of bare silicon wafers to give a resist-coated wafer of Example C1a, C2a, C3a, C1-1a, C2-1a, or C3-1a, respectively. ("Bare" means the silicon wafer did not contain an underlayer and was not pretreated with a primer.) Each resist-coated wafer comprised a resist layer disposed directly on the wafer. Each resist layer had a thickness of 5,000 angstroms (Å).

Examples D1, D2, D3, D1-1, D2-1, and D3-1 (prophetic): preparation of soft baked resists. In six separate experiments heat the resist-coated wafer of Example C1, C2, C3, C1-1, C2-1, or C3-1 for 60 seconds at a temperature of 100° C., and then cool to give the soft baked resists of Examples D1, D2, D3, D1-1, D2-1, and D3-1, respectively.

Examples D1a, D2a, D3a, D1-1a, D2-1a, and D3-1a (prophetic): preparation of soft baked resists. In six separate experiments heat the resist-coated wafer of Example C1a, C2a, C3a, C1-1a, C2-1a, or C3-1a for 60 seconds at a temperature of 100° C., and then cool to give the soft baked resists of Examples D1a, D2a, D3a, D1-1a, D2-1a, and D3-1a, respectively.

Examples E1, E2, E3, E1-1, E2-1, and E3-1 (prophetic): preparation of mask-irradiated resists. In six separate experiments place the soft baked resist of Example D1, D2, D3, D1-1, D2-1, or D3-1 in a mask aligner, and expose the soft baked resist to radiation at 248 nm using conventional illumination through a binary photomask and a KrF scanner, ASML PAS 5500/850D, using an optimized exposure dose (Eop) of 30 millijoules per square centimeter of surface area (mJ/cm$^2$) to give the mask-irradiated resists of Examples E1, E2, E3, E1-1, E2-1, and E3-1, respectively.

Examples E1a, E2a, E3a, E1-1a, E2-1a, and E3-1a (prophetic): preparation of mask-irradiated resists. In six separate experiments place the soft baked resist of Example D1a, D2a, D3a, D1-1a, D2-1a, or D3-1a in a mask aligner, and expose the soft baked resist to radiation at 248 nm using conventional illumination through a binary photomask and a KrF scanner, ASML PAS 5500/850D, using an optimized exposure dose (Eop) of 30 millijoules per square centimeter of surface area (mJ/cm$^2$) to give the mask-irradiated resists of Examples E1a, E2a, E3a, E1-1a, E2-1a, and E3-1a, respectively.

Examples F1, F2, F3, F1-1, F2-1, and F3-1 (prophetic): preparation of post-exposure baked resists. In six separate experiments heat the mask-irradiated wafer of Examples E1, E2, E3, E1-1, E2-1, or E3-1 for 60 seconds at a temperature of 100° C., and then cool to give the post-exposure baked resists of Examples F1, F2, F3, F1-1, F2-1, and F3-1, respectively.

Examples F1a, F2a, F3a, F1-1a, F2-1a, and F3-1a (prophetic): preparation of post-exposure baked resists. In six separate experiments heat the mask-irradiated wafer of Examples E1a, E2a, E3a, E1-1a, E2-1a, or E3-1a for 60 seconds at a temperature of 100° C., and then cool to give the post-exposure baked resists of Examples F1a, F2a, F3a, F1-1a, F2-1a, and F3-1a, respectively.

Examples G1, G2, G3, G1-1, G2-1, and G3-1 (prophetic): preparation of developed resists. In six separate experiments conducted using a single puddle process without pre-wetting, develop the post-exposure baked resists of Examples F1, F2, F3, F1-1, F2-1, or F3-1 by immersion in 2.4 wt % aqueous tetramethylammonium hydroxide (TMAH) for 60 seconds at a temperature of 25° C., and remove the resulting developed resists from the aqueous TMAH to give the developed resists of Examples G1, G2, G3, G1-1, G2-1, and G3-1, respectively. The developed resists are expected to contain resist patterns or images including a 5 micrometer (μm) result. Rinse the developed resists with deionized water to remove residual TMAH, and allow the rinsed resists to dry to give clean developed resists of Examples G1, G2, G3, G1-1, G2-1, and G3-1, respectively.

Examples G1a, G2a, G3a, G1-1a, G2-1a, and G3-1a (prophetic): preparation of developed resists. In six separate experiments conducted using a single puddle process without pre-wetting, develop the post-exposure baked resists of Examples F1a, F2a, F3a, F1-1a, F2-1a, or F3-1a by immersion in 2.4 wt % aqueous tetramethylammonium hydroxide (TMAH) for 60 seconds at a temperature of 25° C., and remove the resulting developed resists from the aqueous TMAH to give the developed resists of Examples G1a, G2a, G3a, G1-1a, G2-1a, and G3-1a, respectively. The developed resists are expected to contain resist patterns or images including a 5 micrometer (μm) result. Rinse the developed resists with deionized water to remove residual TMAH, and allow the rinsed resists to dry to give clean developed resists of Examples G1a, G2a, G3a, G1-1a, G2-1a, and G3-1a, respectively.

Examples H1, H2, H3, H1-1, H2-1, and H3-1 (prophetic): imaged resists. In six separate experiments image the clean developed resists of Examples G1, G2, G3, G1-1, G2-1, and G3-1 using an FE-SEM (Hitachi model number 4700) to obtain cross-section profiles of the resists; and examine the profiles with a Critical Dimension Scanning Electron Microscope (CD-SEM; Hitachi model number 9380) to give the imaged resists of H1, H2, H3, H1-1, H2-1, and H3-1, respectively. If desired, replicate Examples "E" except at different Eop, and process the replicated mask-irradiated resists as described in Examples "F", "G", and "H" to assess mask irradiating dose responsiveness as a change of critical dimension (CD) per unit change in optimal energy (Eop).

Examples H1a, H2a, H3a, H1-1a, H2-1a, and H3-1a (prophetic): imaged resists. In six separate experiments image the clean developed resists of Examples G1a, G2a, G3a, G1-1a, G2-1a, and G3-1a using an FE-SEM (Hitachi model number 4700) to obtain cross-section profiles of the resists; and examine the profiles with a Critical Dimension Scanning Electron Microscope (CD-SEM; Hitachi model number 9380) to give the imaged resists of H1a, H2a, H3a, H1-1a, H2-1a, and H3-1a, respectively. If desired, replicate Examples "E"a except at different Eop, and process the replicated mask-irradiated resists as described in Examples "F"a, "G"a, and "H"a to assess mask irradiating dose responsiveness as a change of critical dimension (CD) per unit change in optimal energy (Eop).

Monomer M1 is unique in that it is the smallest molecular weight monomer that can be used to produce a unit having an acid-dissociable group (i.e., the T(m1) unit. Monomer M3 is smaller than Monomer M1 by 1 carbon atom, but Monomer M3 isomerizes during hydrosilylation and does not give a unit having an acid-dissociable group (i.e., does not give a T(m3) unit but instead gives a T(m3 isomer) unit. Further, T(m2) units made from Monomer M2 have more C atoms than T(m1) units made from Monomer M1, and thus a T(H)T(m2)-containing resin made from M2 has higher C %, and thus lower Si % for a given concentration of units having acid dissociable groups, than a T(H)T(m1)-containing resin having units made from Monomer M1. Beneficially, a T(H)T(m1)-containing resin having units made from Monomer M1 has the lowest C content (carbon content), and thus desirably the highest Si % content for a given concentration of acid-dissociable group units.

In Examples I1, and I2, I3, and I4, NB=t-butyl ester norbornene (also known as bicyclo[2.2.1]heptane-5-carboxylic acid-2-yl 1,1-dimethylethyl ester)

Example I1: Synthesis of silsesquioxane resin (A-3) of formula $T(H)_{0.650}T(NB)_{0.300}T(PEO)_{0.050}$ To a 250 mL flask were added 100 g of $T(H)_{0.70}T(NB)_{0.30}$ (Mw=8700) (30% in toluene), 4.3 g of ally methyl terminated functional polyethylene glycol (MW=350), and a drop of Pt catalyst. The mixture was stirred at 80° C. for 6 hrs and Pt-catalyst was removed using a solid support. The final solution was solvent exchanged to PGMEA, then filtered via 0.2 mm filter, and diluted to 20% solution in PGMEA. GPC (vs. PS): Mw=10,600, PDI=2.95; Si %=22.2% by $^{29}$Si-NMR.

Example I2: Synthesis of T(H)0.656T(M2)0.300T(PPO) 0.044 To a 250 mL flask were added 100 g of $T(H)_{0.70}T(NB)_{0.30}$ (Mw=8700) (30% in toluene), 3.0 g of ally methyl terminated functional polypropylene glycol (MW=250), and a drop of Pt catalyst. The mixture was stirred at 80 C for 6 hrs and Pt-catalyst was removed using a solid support. The final solution was solvent exchanged to PGMEA, then filtered via 0.2 mm filter, and diluted to 20% solution in PGMEA. GPC (vs. PS): Mw=9,670, PDI=2.82; Si %=23.8% by $^{29}$Si-NMR.

Example I3: Synthesis of $T(H)_{0.685}T(NB)_{0.300}T[(EO)_{10}(PO)_4]_{0.015}$ To a 250 mL flask were added 100 g of $T(H)_{0.70}T(NB)_{0.30}$ (Mw=8700) (30% in toluene), 3.0 g of ally methyl terminated functional poly(propylene/ethylene) glycol (CH2=CH—CH2O[(EO)$_{10}$(PO)$_4$]-Me, MW=740), and a drop of Pt catalyst. The mixture was stirred at 80 C for 6 hrs and Pt-catalyst was removed using a solid support. The final solution was solvent exchanged to PGMEA, then filtered via 0.2 mm filter, and diluted to 20% solution in PGMEA. GPC (vs. PS): Mw=11,300, PDI=3.08; Si %=22.9% by $^{29}$Si-NMR.

Example I4: Synthesis of $T(H)_{0.65}T(NB)_{0.30}T(ES)_{0.05}$ To a 1 L three-necked flask were added HSQ resin (500.0 g, 20% in toluene, 1.89 mole), t-butyl ester norbornene (110.0 g, 0.57 mole), ally methyl ester (9.5 g, 0.095 mole), and Pt catalyst (0.081 g, containing 24% of Pt). The mixture was heated to reflux under nitrogen for 12 hrs. After the completion of the reaction, the solution was solvent exchanged to PGMEA. The final solution was then filtered via 0.2 mm filter as 20% solution in PGMEA. GPC (vs. PS): Mw=7,880, PDI=2.77. Si %=25.9% by $^{29}$Si-NMR.

The below claims are incorporated by reference here, and the terms "claim" and "claims" are replaced by the term "aspect" or "aspects," respectively. Embodiments of the invention also include these resulting numbered aspects.

The invention claimed is:

1. A photoresist composition comprising constituent (A) silsesquioxane resin of formula (I):

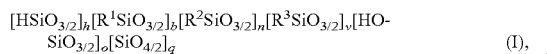

(I), wherein subscript h is a mole fraction from 0.30 to 0.90; each $R^1$ is independently of formula —$CH_2CH_2CH_2CO_2C(R^{1a})_3$ or —$CH(CH_3)CH_2CO_2C(R^{1a})_3$, wherein each $R^{1a}$ is independently an unsubstituted ($C_1$-$C_2$)alkyl; subscript b is a mole fraction from 0 to 0.48; each $R^2$ is independently bicyclo[2.2.1]heptane-5-carboxylic acid-2-yl 1,1-dimethylethyl ester or bicyclo[2.2.1]heptane-5-carboxylic acid-3-yl 1,1-dimethylethyl ester; subscript n is a mole fraction from 0 to 0.35; wherein the sum (b+n) is greater than zero; each $R^3$ is a polyether group; and subscript v is a mole fraction from >0 to 0.15; subscript o is a mole fraction from >0 to 0.30; subscript q is a mole fraction from 0 to 0.1; wherein the sum (h+o+q)=from 0.52 to 0.90; wherein the sum (b+n+v+o+q)=from 0.10 to 0.48; and (B) a photoacid generator; wherein the silsesquioxane resin functions as a photoresist polymer and contains acid cleavable groups.

2. The photoresist composition of claim 1 wherein subscript h is from 0.40 to 0.90.

3. The photoresist composition of claim 1 wherein subscript q is 0.

4. The photoresist composition of claim 1 wherein subscript q is from >0 to 0.10.

5. The photoresist composition of claim 1 wherein subscript o is from 0.01 to 0.10 and subscript q is from 0.005 to 0.02.

6. The photoresist composition of claim 1 wherein subscript b is from 0.11 to 0.40; or each $R^1$ is of formula —$CH_2CH_2CH_2CO_2C(CH_3)_3$ or —$CH(CH_3)CH_2CO_2C(CH_3)_3$; or subscript b is from 0.11 to 0.40 and each $R^1$ is of formula —$CH_2CH_2CH_2CO_2C(CH_3)_3$ or —$CH(CH_3)CH_2CO_2C(CH_3)_3$.

7. The photoresist composition of claim 1 wherein each $R^1$ is independently of formula —$CH_2CH_2CH_2CO_2C(CH_3)_3$.

8. The photoresist composition of claim 1 wherein the silsesquioxane resin has a silicon atom content of from 23.0 weight percent (wt %) to 42 wt %.

9. The photoresist composition of claim 1 wherein the polyether group is an organic substituent having the formula —$(CH_2)_a[O(CR_2)_b]_cOR'$ wherein a=2 to 12, b=2-6; c=2-200; R is H, or a hydrocarbon group such as methyl or ethyl; R' is H, methyl, ethyl, C(O)Me, or other organic groups.

10. The composition of claim 1 wherein the polyether group is

—$(CH_2)_3$—$O(EO)_6$—$OH$;  —$(CH_2)_3$—$O(EO)_6$—$OMe$;

—$(CH_2)_3$—$O(EO)_6$—$OAc$;  —$(CH_2)_3$—$O(PO)_6$—$OH$;

—$(CH_2)_3$—$O(PO)_6$—$OMe$;  —$(CH_2)_3$—$O(PO)_6$—$OAc$;

—$(CH_2)_3$—$O[(EO)_{12}(PO)_4]$—$OH$;

—$(CH_2)_3$—$O[(EO)_{12}(PO)_4]$—$OMe$;

—$(CH_2)_3$—$O[(EO)_{12}(PO)_4]$—$OAc$;  or

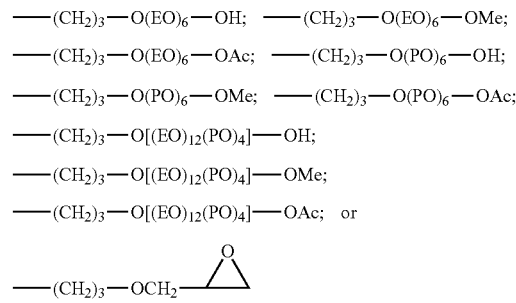

wherein EO is —$(CH_2CH_2O)$— and PO is —$(CHMeCH_2O)$—, Me is methyl, and Ac is acetyl.

11. The photoresist composition of claim 1, wherein the composition further comprises at least one additional constituent.

12. A manufactured article comprising the photoresist composition of claim 1 and a substrate.

13. A process for producing a photoresist image on a substrate or an underlayer disposed on a substrate, the process comprising: (a) coating a substrate, or an underlayer predisposed on a substrate, with the photoresist composition of claim 1 to form a photoresist-coated substrate or a photoresist-coated underlayer comprising an applied photoresist film on the substrate or underlayer; (b) irradiating the applied photoresist film with radiation passing through a mask to produce a mask-irradiated photoresist comprising an exposed film containing a latent pattern; and (c) developing the exposed photoresist film of the mask-irradiated photoresist to produce a photoresist image from the latent image pattern to give a developed photoresist.

* * * * *